United States Patent
Zhang et al.

(10) Patent No.: US 8,643,423 B2
(45) Date of Patent: Feb. 4, 2014

(54) ONE-WIRE COMMUNICATION CIRCUIT AND ONE-WIRE COMMUNICATION METHOD

(75) Inventors: Wei Zhang, Shanghai (CN); Jiulian Dai, Shanghai (CN); Wenhua Cui, Shanghai (CN)

(73) Assignee: O2Micro Inc., Santa Clara, CA (US)

( * ) Notice: Subject to any disclaimer, the term of this patent is extended or adjusted under 35 U.S.C. 154(b) by 0 days.

(21) Appl. No.: 13/567,175

(22) Filed: Aug. 6, 2012

(65) Prior Publication Data

US 2013/0069704 A1  Mar. 21, 2013

(51) Int. Cl.
*H03L 5/00* (2006.01)

(52) U.S. Cl.
USPC .......................................... 327/306; 327/427

(58) Field of Classification Search
USPC ................................................. 327/306, 427
See application file for complete search history.

(56) References Cited

U.S. PATENT DOCUMENTS

| | | | |
|---|---|---|---|
| 8,232,776 B2 | 7/2012 | Tatebayashi | |
| 2007/0235768 A1* | 10/2007 | Nakazawa et al. | 257/211 |
| 2008/0136390 A1* | 6/2008 | Briere | 323/282 |
| 2011/0095736 A1* | 4/2011 | Briere | 323/271 |
| 2012/0248565 A1* | 10/2012 | Tasaka | 257/472 |
| 2013/0015886 A1* | 1/2013 | Johnson | 327/109 |
| 2013/0069704 A1* | 3/2013 | Zhang et al. | 327/306 |

FOREIGN PATENT DOCUMENTS

| | | |
|---|---|---|
| CN | 101953016 A | 1/2011 |
| JP | 11-215716 A | 8/1999 |
| WO | 2010/144690 A1 | 12/2010 |

* cited by examiner

*Primary Examiner* — Adam Houston
(74) *Attorney, Agent, or Firm* — Pillsbury Winthrop Shaw Pittman LLP

(57) ABSTRACT

A communication circuit facilitating communication between a first equipment and a second equipment including a conversion circuit, an input port, an output port, and a communication port is disclosed. The conversion circuit converts an input signal to a first intermediate signal, and converts a second intermediate signal to an output signal. The input port inputs the input signal to the first conversion circuit. The output port outputs the output signal to the control unit. The communication port inputs the second intermediate signal to the conversion circuit, and outputs the first intermediate signal to the second equipment. A voltage of the first intermediate signal is determined based on a voltage of a power source if the first intermediate signal is logic high, and a voltage of the second intermediate signal is determined based on the voltage of the power source if the second intermediate signal is logic high.

20 Claims, 3 Drawing Sheets

ONE-WIRE COMMUNICATION CIRCUIT AND ONE-WIRE COMMUNICATION METHOD

RELATED APPLICATIONS

This application claims priority to Chinese Patent Application No. 201110280911.0, titled "One-wire Communication System and One-wire Communication Method", filed on Sep. 15, 2011, with the State Intellectual Property Office of the People's Republic of China.

BACKGROUND

With the development of the electrical bicycle (EB), there are more and more requirements for the collaboration between a battery management system (BMS) and a charger of the EB. The BMS monitors the state of a battery pack. The charger charges the battery pack according to the state of the battery pack. Digital signals are transferred between the BMS and the charger. A voltage of the digital signal is relatively low, e.g. 3 V, when the digital signal is logic high. A voltage difference between a logic high level of the digital signal and a logic low level of the digital signal is relatively small. There is usually a large amount of electromagnetic interference around the EB. Thus, the bit error rate of the digital signal may be relatively high.

SUMMARY

Embodiments of the present disclosure provide a one-wire communication circuit and a one-wire communication method. The communication circuit in a first equipment is operable for communicating between the first equipment and a second equipment. The communication circuit includes a conversion circuit, an input port, an output port, and a communication port. The conversion circuit is configured to convert an input signal to a first intermediate signal, and convert a second intermediate signal to an output signal. The input port is configured to input the input signal from a control unit in the first equipment to the first conversion circuit. The output port is configured to output the output signal from the conversion circuit to the control unit. The communication port is configured to input the second intermediate signal from the second equipment through a communication line to the conversion circuit, and output the first intermediate signal from the conversion circuit through the communication line to the second equipment. A voltage of the first intermediate signal is determined by a voltage of a power source if the first intermediate signal is logic high, a voltage of the second intermediate signal is determined by the voltage of the power source if the second intermediate signal is logic high.

In another embodiment, a communication system includes a first conversion circuit, a second conversion circuit, and a communication line. The first conversion circuit is configured to convert a first input signal to a first intermediate signal, and convert a second intermediate signal to a second output signal. The second conversion circuit is configured to convert a second input signal to the second intermediate signal, and convert the first intermediate signal to a first output signal. The communication line is coupled between the first conversion circuit and the second conversion circuit. The first intermediate signal and the second intermediate signal are transmitted between the first conversion circuit and the second conversion circuit through the communication line. A voltage of the first intermediate signal is determined by a voltage of a power source if the first intermediate signal is logic high. A voltage of the second intermediate signal is determined by the voltage of the power source if the second intermediate signal is logic high.

In yet another embodiment, a method for communication includes inputting an input signal to a first conversion circuit by a first control unit, converting the input signal to a intermediate signal by the first conversion circuit, transferring the intermediate signal to a second conversion circuit by a communication line, converting the intermediate signal to an output signal by the second conversion circuit, and receiving the output signal from the second conversion circuit by a second control unit.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present disclosure. While the present disclosure will be described in conjunction with these embodiments, it will be understood that they are not intended to limit the present disclosure to these embodiments. On the contrary, the present disclosure is intended to cover alternatives, modifications and equivalents, which may be included within the spirit and scope of the present disclosure as defined by the appended claims.

Furthermore, in the following detailed description of the present disclosure, numerous specific details are set forth in order to provide a thorough understanding of the present disclosure. However, it will be recognized by one of ordinary skill in the art that the present disclosure may be practiced without these specific details. In other instances, well known methods, procedures, components, and circuits have not been described in detail as not to unnecessarily obscure aspects of the present disclosure.

Figure 1:
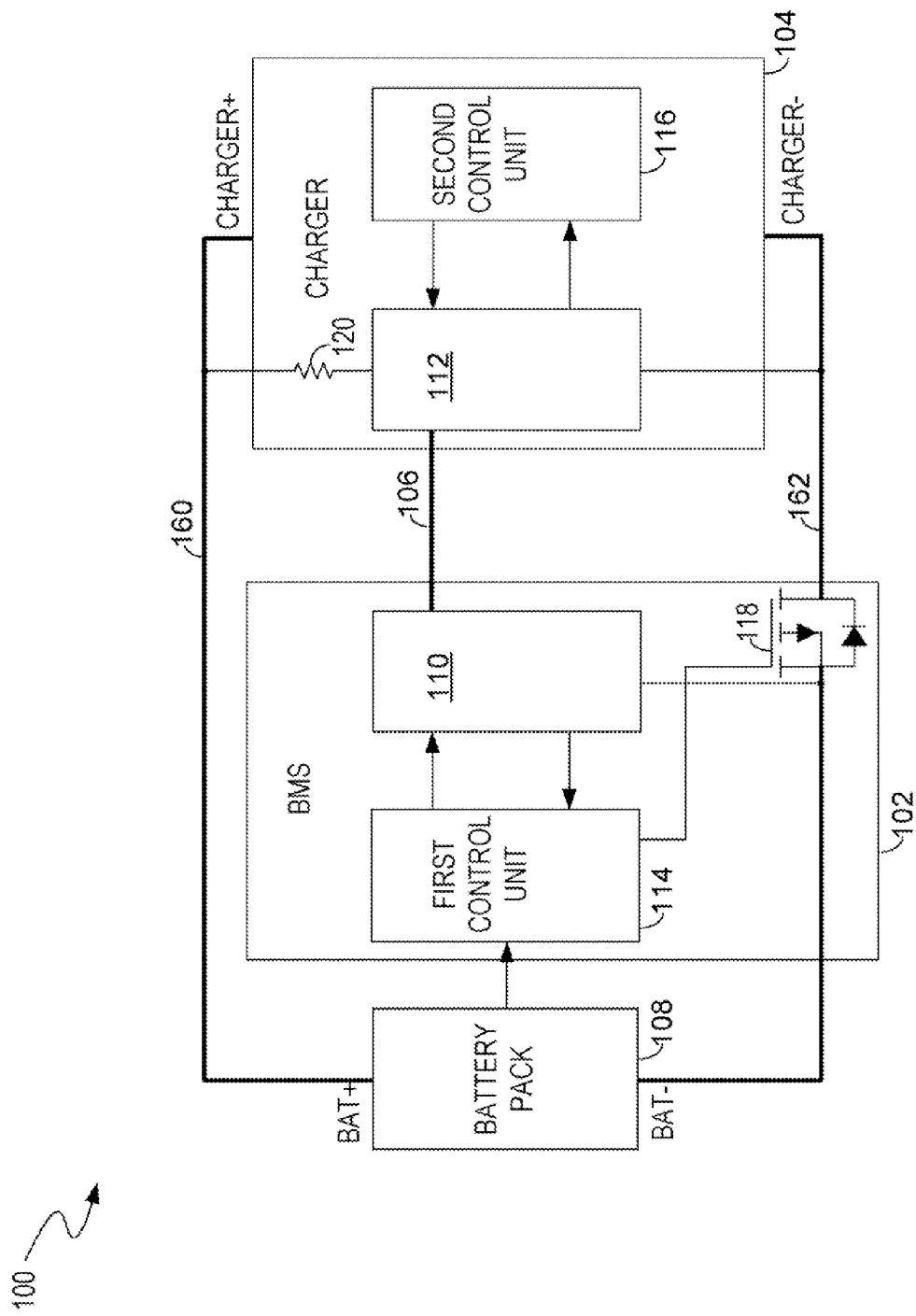
FIG. 1 illustrates a one-wire communication system, in accordance with an embodiment of the present disclosure.

FIG. 1 illustrates a one-wire communication system 100, in accordance with an embodiment of the present disclosure. The one-wire communication system 100 includes a battery management system (BMS) 102, a charger 104, a battery pack 108, a communication line 106, a first power line 160 and a second power line 162. The BMS 102 includes a first control unit 114, a first communication circuit 110, and a discharging switch 118. The charger 104 includes a second control unit 116 and a second communication circuit 112. An anode CHARGER+ of the charger 104 is coupled to an anode BAT+ of the battery pack 108 through the first power line 160, a cathode CHARGER− of the charger 104 is coupled to a cathode BAT− of the battery pack 108 through the second power line 162 and the discharging switch 118. The discharging switch 118 is coupled between the cathode BAT− of the battery pack 108 and the cathode CHARGER− of the charger 104 through the second power line 162, and is controlled by the first control unit 114. If the discharging switch 118 is turned on by the first control unit 114, the battery pack 108 discharges to power a load (not shown in the FIG. 1) coupled between the anode BAT+ and the cathode BAT− of the battery pack 108 via the discharging switch 118. In an exemplary embodiment, the discharging switch 118 is a metal-oxide-semiconductor field-effect transistor (MOSFET) with a built-in body diode. In an alternative embodiment, the discharging switch 118 is a relay coupled in parallel with a diode. The communication line 106 is coupled to the anode BAT+ of the battery pack 108 through a resistor 120 and the second communication circuit 112. The first communication circuit 110 is coupled to the cathode BAT− of the battery pack 108. The second communication circuit 112 is coupled to the cathode CHARGER− of the charger 104. The BMS 102 monitors the battery pack 108 and communicates with the charger 104 through the communication line 106.

In operation, the communication line 106 is used for transferring a signal from the BMS 102 to the charger 104, and used for transferring a signal from the charger 104 to the BMS 102. The charger 104 and the BMS 102 transfer signals to each other at different time periods according to transport protocols. If the BMS 102 transfers a signal to the charger 104, the first control unit 114 in the BMS 102 provides a first input signal to the first communication circuit 110. The first communication circuit 110 converts the first input signal to a first intermediate signal. Then, the first intermediate signal is transferred from the first communication circuit 110 through the communication line 106 to the second communication circuit 112. The second communication circuit 112 converts the first intermediate signal to a first output signal. Then, the first output signal is transferred to the second control unit 116 in the charger 104. A voltage of the first intermediate signal in the communication line 106 is determined based on a voltage of the battery pack 108 if the first intermediate signal is logic high. The voltage of the battery pack 108 is relatively high. Advantageously, the voltage of the first intermediate signal while the first intermediate signal is logic high, is greater than a voltage of the first input signal and is greater than a voltage of the first output signal while the first input signal and the first output signal are logic high.

If the charger 104 transfers a signal to the BMS 102, the second control unit 116 in the charger 104 provides a second input signal to the second communication circuit 112. The second communication circuit 112 converts the second input signal to a second intermediate signal. Then, the second intermediate signal is transferred from the second communication circuit 112 through the communication line 106 to the first communication circuit 110. The first communication circuit 110 converts the second intermediate signal to a second output signal. Then, the second output signal is transferred to the first control unit 114 in the BMS 102. A voltage of the second intermediate signal in the communication line 106 is determined based on a voltage of the battery pack 108 if the second intermediate signal is logic high. The voltage of the battery pack 108 is relatively high. Advantageously, the voltage of the second intermediate signal, while the second intermediate signal logic high, is greater than a voltage of the second input signal and greater than a voltage of the second output signal while the second input signal and the second output signal are logic high.

During the communication process, the voltage of the first intermediate signal and the voltage of the second intermediate signal are relatively high, (e.g. 38 V) if the first intermediate signal and the second intermediate signal are logic high respectively. A voltage difference between a logic high level of an intermediate signal and a logic low level of an intermediate signal is relatively large, such that a bit error rate of the intermediate signal can be relatively low, where communication is more reliable.

To establish communication between the first communication circuit 110 and the second communication 112, a voltage of reference ground of the first communication circuit 110 needs to be equal to a voltage of reference ground of the second communication circuit 112, such that the first communication circuit 110 and the second communication circuit 112 can identify signals properly. The first communication circuit 110 is coupled to the cathode BAT− of the battery pack 108. The second communication circuit 112 is coupled to the cathode CHARGER− of the charger 104. The voltage of the reference ground of the first communication circuit 110 (i.e., the voltage of the cathode BAT− of the battery pack 108) is the same as the voltage of the reference ground of the second communication circuit 112 (i.e., the voltage of the cathode CHARGER− of the charger 104) if the discharging switch 118 is turned on. The first control unit 114 in the BMS 102 turns off the discharging switch 118 to protect the battery pack 108 if a voltage of the battery pack 108 decreases below a predetermined voltage level. In FIG. 1, a MOSFET may be used as the discharging switch 118, and a current can flow from the first communication circuit 110 through the body diode of the discharging switch 118 to the second communication circuit 112. Neglecting the small voltage drop across the body diode, the voltage of the reference ground of the first communication circuit 110 is the same as the voltage of the reference ground of the second communication circuit 112. Therefore, the first communication circuit 110 can also communicate with the second communication circuit 112 even if the discharging switch 118 is turned off. In other words, the body diode provides a path between the first communication circuit 110 and the second communication circuit 112, which enables communication when the discharging switch 118 is off. In another embodiment, a relay coupled in parallel with a diode is used as the discharging switch 118 and a current can flow from the first communication circuit 110 through the diode of the discharging switch 118 to the second communication circuit 112, such that the first communication circuit 110 can also communicate with the second communication circuit 112 even if the relay is turned off. Therefore, the BMS 102 can communicate with the charger 104 regardless of whether the discharging switch 118 is turned on or off.

Figure 2:
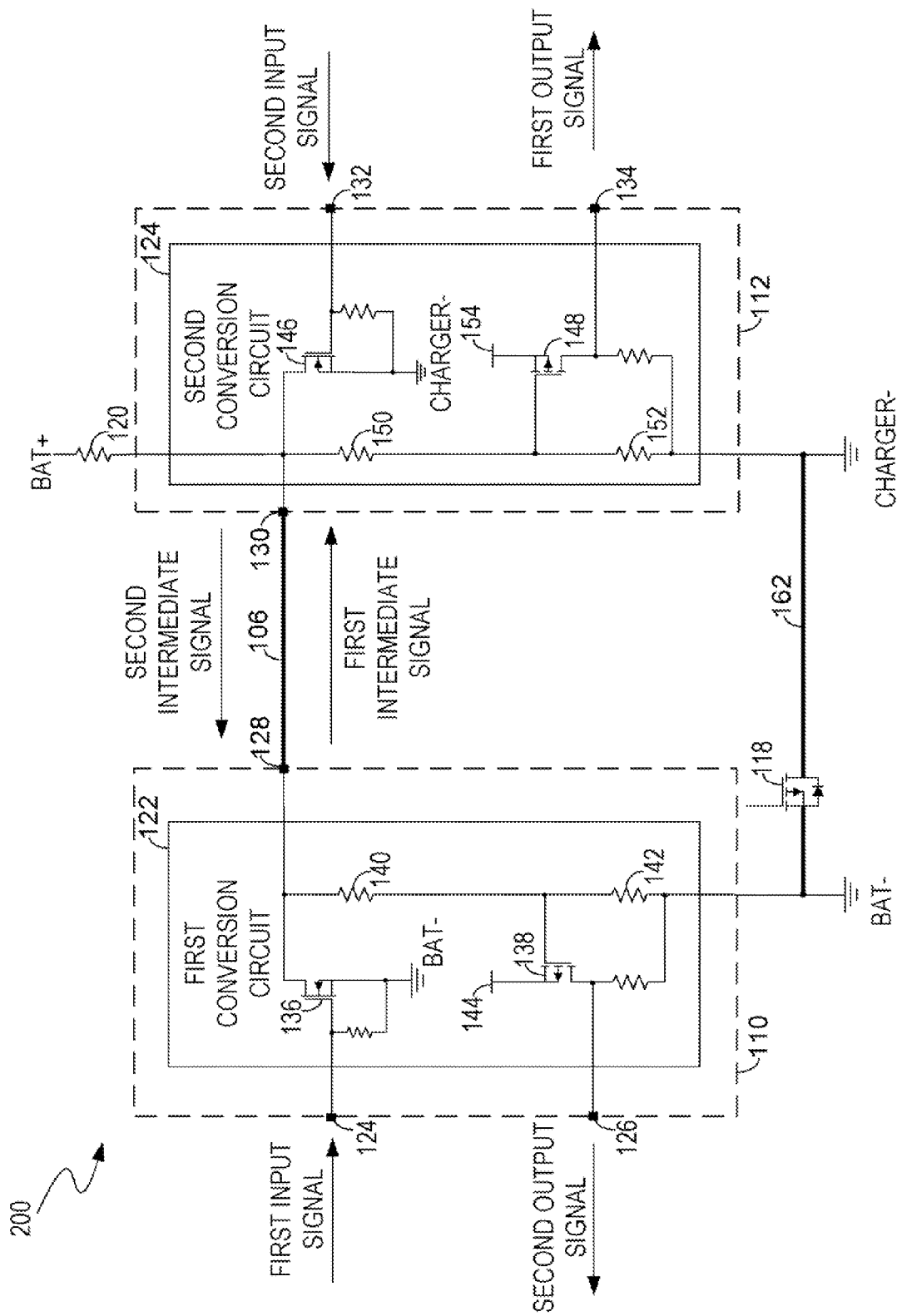
FIG. 2 illustrates a first communication circuit and a second communication circuit as shown in FIG. 1, in accordance with an embodiment of the present disclosure.

FIG. 2 illustrates a first communication circuit 110 and a second communication circuit 112 of FIG. 1, in accordance with an embodiment of the present disclosure. FIG. 2 may be described in combination with FIG. 1. The first communication circuit 110 includes a first conversion circuit 122, a first input port 124, a first output port 126 and a first communication port 128. The first input port 124 is operable for inputting the first input signal from the first control unit 114 in the BMS 102 to the first conversion circuit 122. The first output port 126 is operable for outputting the second output signal from the first conversion circuit 122 to the first control unit 114. The first communication port 128 is operable for inputting the second intermediate signal from the charger 104 through the communication line 106 to the first conversion circuit 122, and for outputting the first intermediate signal from the first conversion circuit 122 through the communication line 106 to the charger 104. The first conversion circuit 122 is configured to convert the first input signal to the first intermediate signal, and convert the second intermediate signal to the second output signal.

The first conversion circuit 122 includes a first transistor 136 and a second transistor 138. In an exemplary embodiment, the first transistor 132 may be an N type metal-oxidesemiconductor field-effect transistor (NMOSFET). A source of the first transistor 136 is coupled to the cathode BAT− of the battery pack 108. A drain of the first transistor 136 is coupled to the first communication port 128. A gate of the first transistor 136 is coupled to the first input port 124. In an exemplary embodiment, the second transistor 138 may be a P type metal-oxide-semiconductor field-effect transistor (PMOSFET). A drain of the second transistor 138 is coupled to the first output port 126. A source of the second transistor 138 is coupled to a voltage source 144. A gate of the second transistor 138 is coupled to the cathode BAT− of the battery pack 124 through a resistor 142, and coupled to the first communication port 128 through a resistor 140.

The second communication circuit 112 includes a second conversion circuit 124, a second input port 132, a second output port 134 and a second communication port 130. The second input port 132 is operable for inputting the second input signal from the second control unit 116 in the charger 104 to the second conversion circuit 124. The second output port 134 is operable for outputting the first output signal from the second conversion circuit 124 to the second control unit 116. The second communication port 130 is operable for inputting the first intermediate signal from the BMS 102 through the communication line 106 to the second conversion circuit 124, and for outputting the second intermediate signal from the second conversion circuit 122 through the communication line 106 to the BMS 102. The second conversion circuit 124 is configured to convert the second input signal to the second intermediate signal, and convert the first intermediate signal to the first output signal.

The second conversion circuit 124 includes a third transistor 146 and a fourth transistor 148. In an exemplary embodiment, the third transistor 146 may be an NMOSFET. A source of the third transistor 146 is coupled to the cathode CHARGER− of the charger 104. A drain of the third transistor 146 is coupled to the second communication port 130. A gate of the third transistor 146 is coupled to the second input port 132. In an exemplary embodiment, the fourth transistor 148 may be a PMOSFET. A drain of the fourth transistor 148 is coupled to the second output port 134. A source of the fourth transistor 148 is coupled to a voltage source 154. A gate of the fourth transistor 148 is coupled to the cathode CHARGER− of the charger 104 through a resistor 152, and coupled to the second communication port 130 through a resistor 150.

In operation, if the BMS 102 transfers a signal to the charger 104, the first control unit 114 in the BMS 102 provides a first input signal to the first conversion circuit 122 through the first input port 124. The first transistor 136 may be an NMOSFET. Thus, if the first input signal is logic high, the first transistor 136 is turned on according to the first input signal. The communication line 106 is coupled to the cathode BAT− of the battery pack 108. Therefore, the voltage of first intermediate signal in the communication line 106 is approximately equal to zero, and the first intermediate signal is logic low. Thus, a voltage across the resistor 150 and a voltage across the resistor 152 are approximately equal to zero. The fourth transistor 148 may be a PMOSFET. Therefore, the fourth transistor 148 is turned on. A voltage of the second output port 134 is approximately equal to the voltage of the voltage source 154, e.g. 3 V. As described above, if the first input port 124 receives the first input signal with a logic high level, the first output signal with a logic high level is outputted through the second output port 134.

If the first input signal is logic low, the first transistor 136 is turned off according to the first input signal. The communication line 106 is coupled to the cathode BAT− of the battery pack 108 through the resistor 140 and the resistor 142. Therefore, the voltage of the first intermediate signal in the communication line 106 is equal to a total voltage across the resistor 140 and the resistor 142. The voltage across the resistor 140 is proportional to the voltage of the battery pack 108, and is determined by a ratio of a resistance of the resistor 140, a resistance of the resistor 142, and the resistance of the resistor 120. The voltage across the resistor 142 is proportional to the voltage of the battery pack 108, and is determined by a ratio of a resistance of the resistor 140, a resistance of the resistor 142, and the resistance of the resistor 120. Thus, the voltage of the first intermediate signal is determined based on the voltage of the battery pack 108, and can be relatively high, e.g. 38 V. The first intermediate signal is logic high. Thus, a voltage of the resistor 152 is high enough that the fourth transistor 148 is turned off. A voltage of the second output port 134 is approximately equal to zero. As described above, if the first input port 124 receives the first input signal with a logic low level, the first output signal with a logic low level is outputted through the second output port 134. Advantageously, a voltage difference between a logic high level of the first intermediate signal and a logic low level of the first intermediate signal is relatively large, and therefore the logic high level and the logic low level are more distinct from each other. An anti-interference ability of the one-wire communication system 100 is strengthened.

If the charger 104 transfers a signal to the BMS 102, the second control unit 116 in the charger 104 provides a second input signal to the second conversion circuit 124 through the second input port 132. The third transistor 146 may be an NMOSFET. Thus, if the second input signal is logic high, the third transistor 146 is turned on according to the second input signal. The communication line 106 is coupled to the cathode CHARGER− of the charger 104. Therefore, the voltage of the second intermediate signal in the communication line 106 is approximately equal to zero, and the second intermediate signal is logic low. Thus, a voltage of the resistor 140 and a voltage of the resistor 142 are approximately equal to zero. The second transistor 138 may be a PMOSFET. Therefore, the second transistor 138 is turned on. A voltage of the first output port 126 is approximately equal to the voltage of the voltage source 144, e.g. 3 V. As described above, if the second input port 132 receives the second input signal with a logic high level, the second output signal with a logic high level is outputted through the first output port 126.

If the second input signal is logic low, the third transistor 146 is turned off according to the second input signal. The communication line 106 is coupled to the cathode CHARGER− of the charger 104 through the resistor 150 and the resistor 152. Therefore, the voltage of the second intermediate signal in the communication line 106 is equal to a total voltage across the resistor 150 and the resistor 152. The voltage across the resistor 150 is proportional to the voltage of the battery pack 108, and is determined by a ratio of a resistance of the resistor 150, a resistance of the resistor 152, and the resistance of the resistor 120. The voltage across the resistor 152 is proportional to the voltage of the battery pack 108, and is determined by a ratio of a resistance of the resistor 150, a resistance of the resistor 152, and the resistance of the resistor 120. Thus, the voltage of second intermediate signal is determined based on the voltage of the battery pack 108, and can be relatively high, e.g. 38 V. The second intermediate signal is logic high. Thus, a voltage of the resistor 142 is high enough that the second transistor 138 is turned off. A voltage of the first output port 126 is approximately equal to zero. As described above, if the second input port 132 receives the second input signal with a logic low level, the second output signal with a logic low level is outputted through the first output port 126. Advantageously, a voltage difference between a logic high level of the second intermediate signal and a logic low level of the second intermediate signal is relatively large, and therefore the logic high level and the logic low level are more distinct from each other. An anti-interference ability of the one-wire communication system 100 is strengthened.

Figure 3:
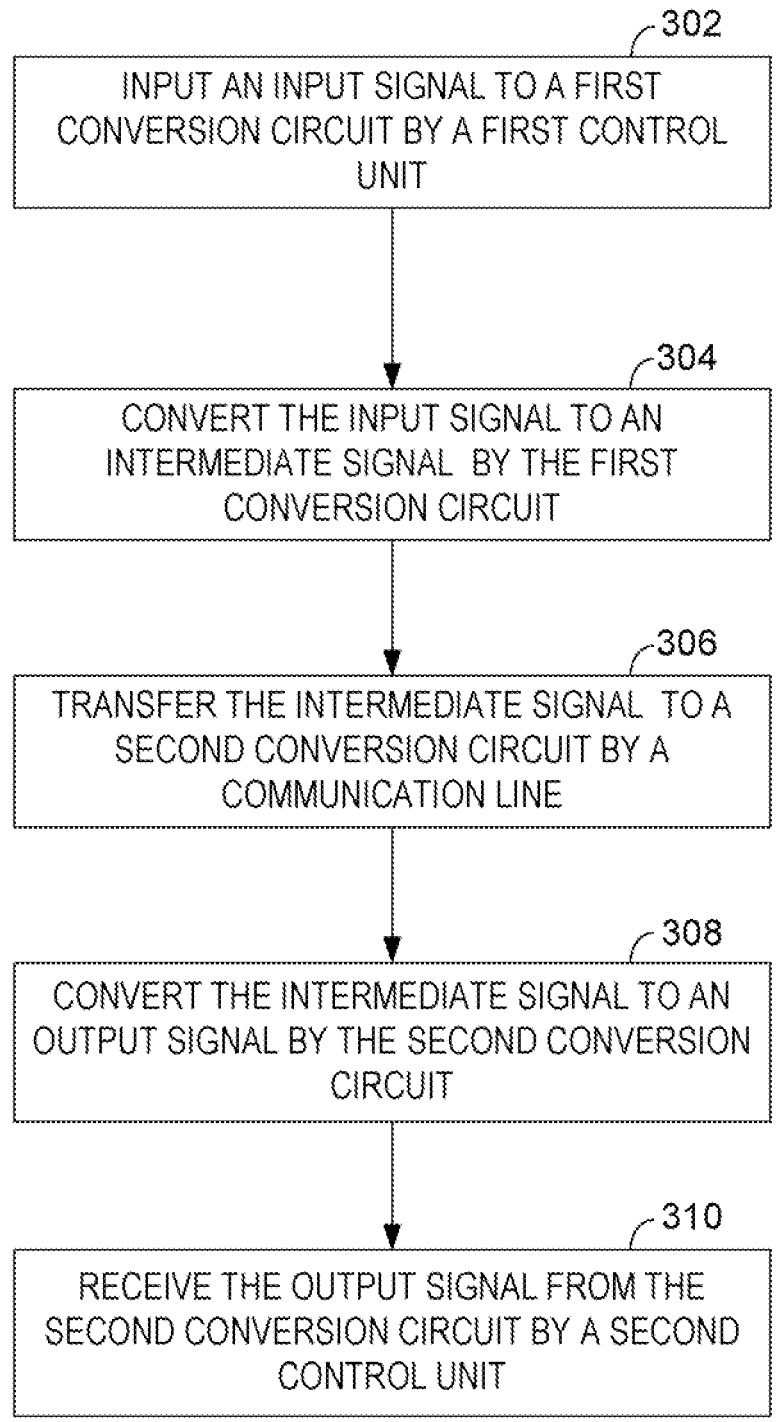
FIG. 3 illustrates a flowchart of a method for one-wire communication, in accordance with an embodiment of the present disclosure.

FIG. 3 shows a flowchart 300 of a method for one-wire communication, in accordance with an embodiment of the present disclosure. FIG. 3 may be described in combination with FIG. 1 and FIG. 2. In block 302, a first control unit inputs an input signal to a first conversion circuit. In block 304, the first conversion circuit converts the input signal to an intermediate signal. In block 306, a communication line transfers the intermediate signal to a second conversion circuit. In block 308 the second conversion circuit converts the intermediate signal to an output signal. In block 310, a second control unit receives the output signal from the second conversion circuit. The voltage of the intermediate signal, while the intermediate signal is logic high, is greater than a voltage of the input signal and greater than a voltage of the output signal while the input signal and the output signal are logic high.

As described above, a voltage of the first intermediate signal in the communication line 106 is determined by the voltage of the battery pack 108 if the first intermediate signal is logic high, a voltage of the second intermediate signal in the communication line 106 is determined by the voltage of the battery pack 108 if the second intermediate signal is logic high. More specifically, the voltage of the first intermediate signal in the communication line 106 is proportional to the voltage of the battery pack 108 if the first intermediate signal is logic high, the voltage of the second intermediate signal in the communication line 106 is proportional to the voltage of the battery pack 108 if the second intermediate signal is logic high. Advantageously, the voltage of the power source is relatively high and thus a voltage difference between a logic high level of the intermediate signal and a logic low level of the intermediate signal is relatively large, and therefore the logic high level and the logic low level are more distinct from each other. An anti-interference ability of the one-wire communication system 100 is improved. The one-wire communication system can be used for communication not only between a BMS 102 and the charger 104, but also between other equipments that require communication (e.g. motor controller, or test equipment).

While the foregoing description and drawings represent embodiments of the present disclosure, it will be understood that various additions, modifications and substitutions may be made therein without departing from the spirit and scope of the principles of the present disclosure as defined in the accompanying claims. One skilled in the art will appreciate that the disclosure may be used with many modifications of form, structure, arrangement, proportions, materials, elements, and components and otherwise, used in the practice of the disclosure, which are particularly adapted to specific environments and operative requirements without departing from the principles of the present disclosure. The presently disclosed embodiments are therefore to be considered in all respects as illustrative and not restrictive, the scope of the disclosure being indicated by the appended claims and their legal equivalents, and not limited to the foregoing description.

What is claimed is:

1. A communication circuit for communicating between a first equipment and a second equipment, comprising:
    a conversion circuit that is configured to convert an input signal to a first intermediate signal, and convert a second intermediate signal to an output signal;
    an input port that is configured to input said input signal from a control unit in said first equipment to said conversion circuit;
    an output port that is configured to output said output signal from said conversion circuit to said control unit; and
    a communication port that is configured to input said second intermediate signal from said second equipment through a communication line to said conversion circuit, and output said first intermediate signal from said conversion circuit through said communication line to said second equipment, wherein
    a voltage of said first intermediate signal is determined based on a voltage of a power source if said first intermediate signal is logic high, and
    a voltage of said second intermediate signal is determined based on said voltage of said power source if said second intermediate signal is logic high.

2. The communication circuit of claim 1, wherein said communication circuit is coupled to a cathode of said first equipment.

3. The communication circuit of claim 1, wherein said voltage of said first intermediate signal while said first intermediate signal is logic high, is greater than a voltage of said input signal while said input signal is logic high.

4. The communication circuit of claim 1, wherein said voltage of said second intermediate signal while said second intermediate signal is logic high, is greater than a voltage of said output signal while said output signal is logic high.

5. The communication circuit of claim 1, wherein
    said voltage of said first intermediate signal is proportional to said voltage of said power source if said first intermediate signal is logic high; and
    said voltage of said second intermediate signal is proportional to said voltage of said power source if said second intermediate signal is logic high.

6. The communication circuit of claim 1, wherein said conversion circuit comprises:
    a first transistor, coupled between said input port and said communication port, that is configured to convert said input signal to said first intermediate signal; and
    a second transistor, coupled between said output port and said communication port, that is configured to convert said second intermediate signal to said output signal.

7. The communication circuit of claim 6, wherein
    said first transistor is an N type metal-oxide-semiconductor field-effect transistor; and
    said second transistor is a P type metal-oxide-semiconductor field-effect transistor.

8. The communication circuit of claim 1, wherein
    said first intermediate signal is logic high if said input signal is logic low;
    said first intermediate signal is logic low if said input signal is logic high;
    said output signal is logic high if said second intermediate signal is logic low; and
    said output signal is logic low if said second intermediate signal is logic high.

9. A communication system, comprising:
    a first conversion circuit configured to convert a first input signal to a first intermediate signal, and convert a second intermediate signal to a second output signal;
    a second conversion circuit configured to convert a second input signal to said second intermediate signal, and convert said first intermediate signal to a first output signal; and
    a communication line coupled between said first conversion circuit and said second conversion circuit, wherein said first intermediate signal and said second intermediate signal are transmitted between said first conversion circuit and said second conversion circuit through said communication line, a voltage of said first intermediate signal is determined based on a voltage of a power source if said first intermediate signal is logic high, and a voltage of said second intermediate signal is determined based on the voltage of said power source if said second intermediate signal is logic high.

10. The communication system of claim 9, wherein
said first conversion circuit is in a first equipment, and is coupled to a cathode of said first equipment;
said second conversion circuit is in a second equipment, and is coupled to a cathode of said second equipment; and
a power line is coupled between said cathode of said first equipment and said cathode of said second equipment.

11. The communication system of claim 10, further comprising:
a metal-oxide-semiconductor field-effect transistor coupled between said cathode of said first equipment and said cathode of said second equipment through said power line.

12. The communication system of claim 10, further comprising a relay coupled in parallel with a diode, wherein said relay and said diode are coupled between said cathode of said first equipment and said cathode of said second equipment through said power line.

13. The communication system of claim 9, wherein said communication line is coupled to said power source through said second conversion circuit.

14. The communication system of claim 9, wherein said voltage of said first intermediate signal while said first intermediate signal is logic high, is greater than a voltage of said first input signal and is greater than a voltage of said first output signal while said first input signal and said first output signal are logic high.

15. The communication system of claim 9, wherein said voltage of said second intermediate signal while said second intermediate signal is logic high, is greater than a voltage of said second input signal and is greater than a voltage of said second output signal while said second input signal and said second output signal are logic high.

16. The communication system of claim 9, wherein
said voltage of said first intermediate signal is proportional to said voltage of said power source if said first intermediate signal is logic high; and
said voltage of said second intermediate signal is proportional to said voltage of said power source if said second intermediate signal is logic high.

17. The communication system of claim 9, wherein
said first conversion circuit comprises:
a first transistor configured to convert said first input signal to said first intermediate signal, and
a second transistor configured to convert said second intermediate signal to said second output signal; and
said second conversion circuit comprises:
a third transistor configured to convert said second input signal to said second intermediate signal, and
a fourth transistor configured to convert said first intermediate signal to said first output signal.

18. The communication circuit of claim 17, wherein
said first transistor is an N type metal-oxide-semiconductor field-effect transistor;
said second transistor is a P type metal-oxide-semiconductor field-effect transistor;
said third transistor is an N type metal-oxide-semiconductor field-effect transistor; and
said fourth transistor is a P type metal-oxide-semiconductor field-effect transistor.

19. A method for communication, comprising:
inputting, by a first control unit, an input signal to a first conversion circuit;
converting, by said first conversion circuit, said input signal to an intermediate signal;
transferring, by a communication line, said intermediate signal to a second conversion circuit;
converting, by said second conversion circuit, said intermediate signal to an output signal; and
receiving, by a second control unit, said output signal from said second conversion circuit.

20. The method of claim 19, wherein said voltage of said intermediate signal while said intermediate signal is logic high, is greater than a voltage of said input signal and a voltage of said output signal while said input signal and said output signal are logic high.

* * * * *